United States Patent
Abe et al.

(10) Patent No.: US 8,515,219 B2
(45) Date of Patent: Aug. 20, 2013

(54) OPTICAL DEVICE

(75) Inventors: Yosuke Abe, Nishitokyo (JP); Masafumi Ide, Nishitokyo (JP); Toru Takizawa, Nishitokyo (JP); Takaaki Nozaki, Nishitokyo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 312 days.

(21) Appl. No.: 13/108,133

(22) Filed: May 16, 2011

(65) Prior Publication Data

US 2011/0280512 A1   Nov. 17, 2011

(30) Foreign Application Priority Data

May 14, 2010 (JP) .................................. 2010-111905

(51) Int. Cl.
 *G02B 6/12* (2006.01)
(52) U.S. Cl.
 USPC ................................................ 385/14
(58) Field of Classification Search
 None
 See application file for complete search history.

(56) References Cited

U.S. PATENT DOCUMENTS

| | | | | |
|---|---|---|---|---|
| 5,165,004 A * | 11/1992 | Okamoto et al. | ............ | 385/122 |
| 5,585,330 A * | 12/1996 | Cadotte et al. | ................ | 505/210 |
| 6,093,334 A * | 7/2000 | Suzuki et al. | .................... | 216/24 |
| 6,847,750 B1 * | 1/2005 | Baumann et al. | ............... | 385/16 |
| 6,856,752 B2 * | 2/2005 | Bischel et al. | ................ | 385/140 |
| 7,480,317 B2 * | 1/2009 | Hu et al. | .......................... | 372/21 |
| 2010/0054653 A1 * | 3/2010 | Carothers | ......................... | 385/1 |
| 2010/0311195 A1 * | 12/2010 | Matsui et al. | ..................... | 438/31 |
| 2012/0243825 A1 * | 9/2012 | Takizawa et al. | ............... | 385/14 |
| 2012/0328237 A1 * | 12/2012 | Ide et al. | ......................... | 385/14 |
| 2013/0022323 A1 * | 1/2013 | Takizawa et al. | ................ | 385/92 |

FOREIGN PATENT DOCUMENTS

| | | |
|---|---|---|
| JP | 06-338650 A | 12/1994 |
| JP | 2003-017793 A | 1/2003 |

* cited by examiner

*Primary Examiner* — Sung Pak
(74) *Attorney, Agent, or Firm* — Sughrue Mion, PLLC

(57) ABSTRACT

In an optical device 1 in which a wavelength converting element 20 is disposed as an optical element on a silicon substrate 10, configuration includes heaters 40*a* and 40*b* formed on the silicon substrate 10; and micro bumps 30*a*, 30*b* that are made of Au, that bond the silicon substrate 10 and the wavelength converting element 20, and that transfer the heat generated by the heaters 40*a*, 40*b* to the wavelength converting element 20.

8 Claims, 12 Drawing Sheets

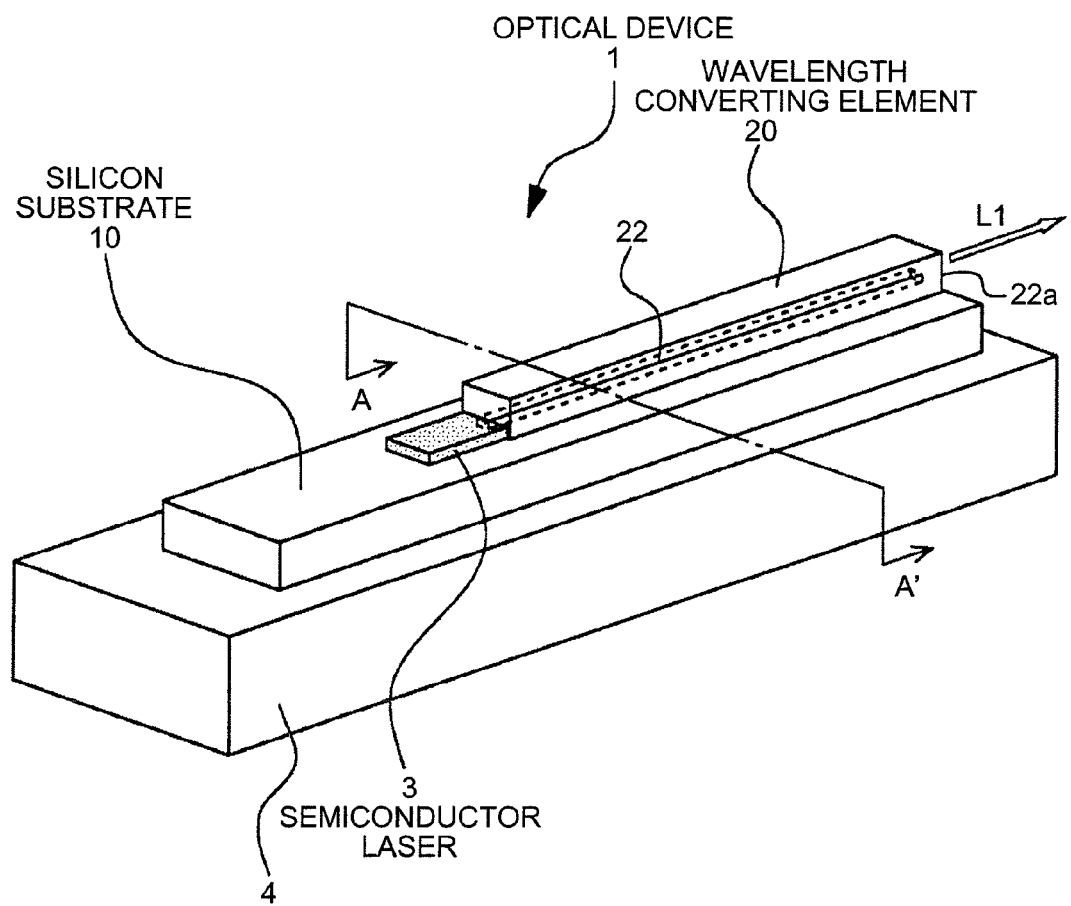

FIG.4A
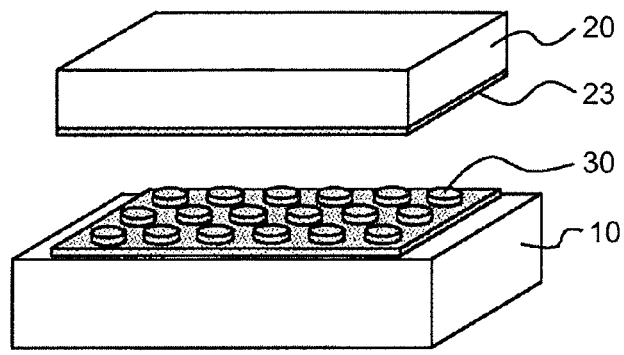
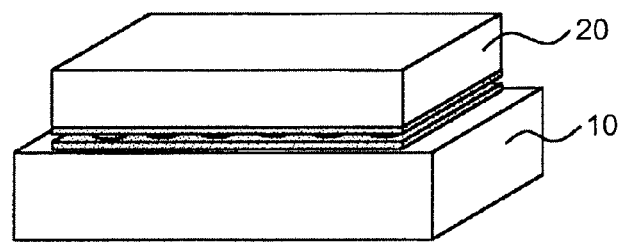
FIG.4B
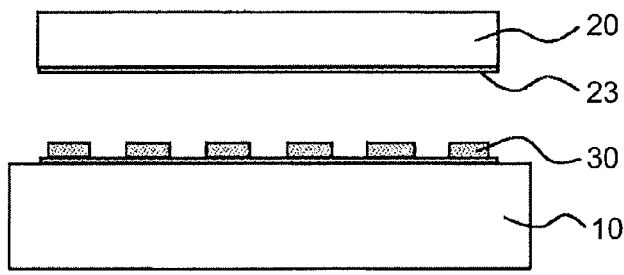
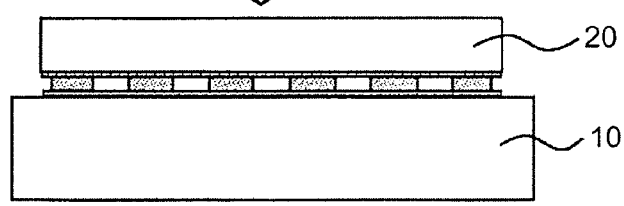

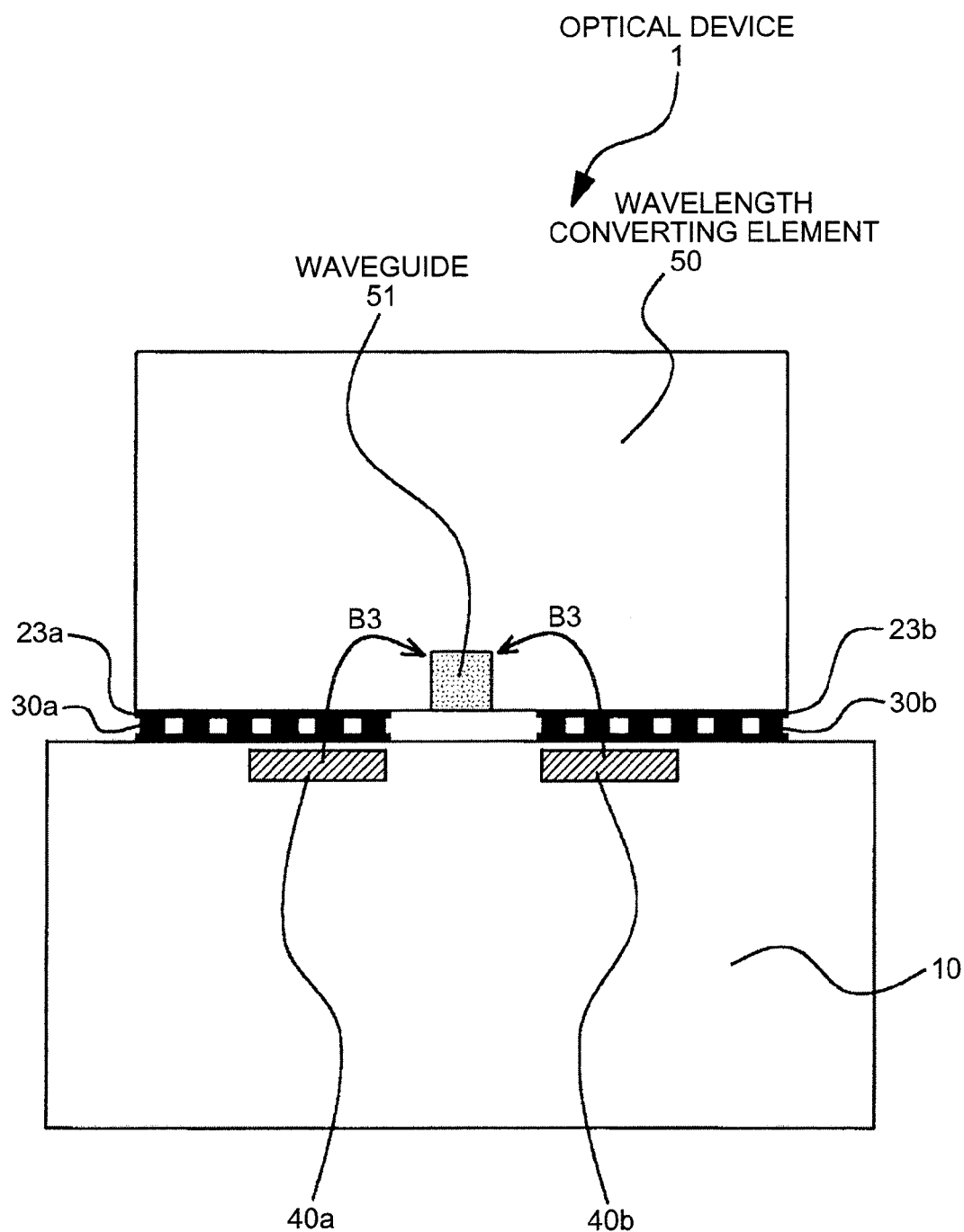

OPTICAL DEVICE

BACKGROUND OF THE INVENTION

1. Field of the Invention

The present invention relates to an optical device that includes an optical element such as a wavelength converting element that varies the emitted wavelength of laser light, and particularly relates to an optical device that includes a means of correcting temperature characteristics of the wavelength converting element.

2. Description of the Related Art

Short-wavelength (e.g., blue and green) laser optical sources are under extensive development in the fields of, for example, laser projectors and high density optical storage. These short-wavelength laser optical sources output blue or green laser light by converting into a harmonic, the infrared light of a fundamental wave output by a semiconductor laser. Here, the wavelength converting elements used are made of lithium niobate ($LiNbO_3$) as a primary component, nevertheless, the conversion efficiency of the harmonic is temperature dependent and has a characteristic of varying greatly according to temperature variations.

FIG. 12A is a graph depicting an example of variation in harmonic output versus environmental temperature of a wavelength converting element. As can be understood from the graph, when the environmental temperature is in a low region, the wavelength converting element output drops and even when the environmental temperature is in a high region, the output drops. In this manner, since the harmonic output by the wavelength converting element varies greatly with respect to temperature, conversion of good efficiency is realized and to obtain laser light having a stable harmonic, a temperature adjusting means for correcting the temperature characteristic of the wavelength converting element is essential. To adjust the wavelength converting element to a given temperature, a laser optical source having a heater disposed at the wavelength converting element is known (see, for example, Japanese Patent Application Laid-Open Publication No. H6-338650 (page 5, FIG. 5)).

FIG. 12B depicts an example of the short-wavelength laser optical source disclosed in Japanese Patent Application Laid-Open Publication No. H6-338650. In FIG. 12B, reference numeral 101 is a silicon substrate; reference numeral 110 is a 0.8 μm-band semiconductor laser; and reference numeral 120 is a wavelength converting element. A fundamental wave 112 is output from an active layer 111 of the semiconductor laser 110, input to a waveguide 121 of the wavelength converting element 120, and a harmonic of blue laser light 130 is output. At a portion of a surface of the silicon substrate 101 (a surface contacting the wavelength converting element 120), a groove 102 is formed by etching.

Further, at a lower portion of the wavelength converting element 120, i.e., near the waveguide 121, a thin film heater 122 is formed of a Ti film. By energizing the thin film heater 122, the temperature of the wavelength converting element 120 can be maintained at a given temperature. Furthermore, the thin film heater 122 does not contact the silicon substrate 101 because of the groove 102, whereby a configuration that makes it difficult for the heat of the thin film heater 122 to be transferred to the silicon substrate 101 is formed. Consequently, the temperature of the wavelength converting element 120 is maintained at a given temperature and stable output of the laser light is shown.

A configuration is further known where a heater for adjusting the temperature of the wavelength converting element is not formed at the wavelength converting element, but rather on the substrate; and the substrate and the semiconductor laser are bonded by a soldering pattern or an adhesive having a high-thermal conductivity, whereby the heat generated by the heater is transferred to the semiconductor laser (see, for example, Japanese Patent Application Laid-Open Publication No. 2003-17793 (page 3, FIG. 1)). The laser optical source of this patent document has a configuration in which a thin film heater is formed on an insulation film. On the thin film heater, a soldering pattern is formed mounting a semiconductor laser chip that includes a variable wavelength region. Consequently, by energizing the thin film heater on the substrate, heat from the heater is transferred through the soldering pattern to the semiconductor laser chip, enabling adjustment of the temperature of the variable wavelength region.

Nevertheless, in the configuration recited in Japanese Patent Application Laid-Open Publication No. H6-338650, since the thin film heater is formed on the wavelength converting element, a problem arises in that a process of forming the thin film heater is added to the fabrication process of the wavelength converting element, increasing the number of fabrication processes as well as man-hours. Furthermore, wiring and electrodes for energizing the thin film heater on the wavelength converting element must be disposed at both the wavelength converting element and the silicon substrate, whereby as a laser optical source, the structure becomes complicated, making it easy for problems such as poor electrode contact to arise.

In the configuration recited in Japanese Patent Application Laid-Open Publication No. 2003-17793, a problem arises in that although the substrate and the semiconductor laser chip are bonded by soldering, bonding the semiconductor laser chip by a uniform soldering coating to efficiently transfer the heat generated by the heater to the semiconductor laser chip is difficult. Furthermore, although obviously, soldering requires an application of heat to melt the soldering material and with the application of heat, there is a risk of damage to the substrate and/or the semiconductor laser chip. Moreover, errant positioning of the substrate and the semiconductor laser chip occurs easily with soldering.

SUMMARY OF THE INVENTION

It is an object of the present invention to at least solve the above problems in the conventional technologies.

An optical device according to one aspect of the invention is an optical device in which an optical element that has a waveguide is mounted to a substrate. The optical device includes a heater formed on the substrate; and a micro bump that is disposed above the heater and in a region other than a region below the waveguide, that is made of Au, that bonds the substrate and the optical element, and that transfers to the optical element, heat generated by the heater. The optical element is mounted to the substrate such that the waveguide is in proximity to the substrate. The heater and the micro bump are disposed near the waveguide.

BRIEF DESCRIPTION OF THE DRAWINGS

FIG. 3 is a perspective view depicting an external view of an optical device of the present invention;

FIGS. 4A and 4B are schematics of micro bumps of the first embodiment;

FIG. 8 is a cross sectional view of the optical device of a second embodiment of the present invention;

DETAILED DESCRIPTION OF THE PREFERRED EMBODIMENTS

Figure 1:
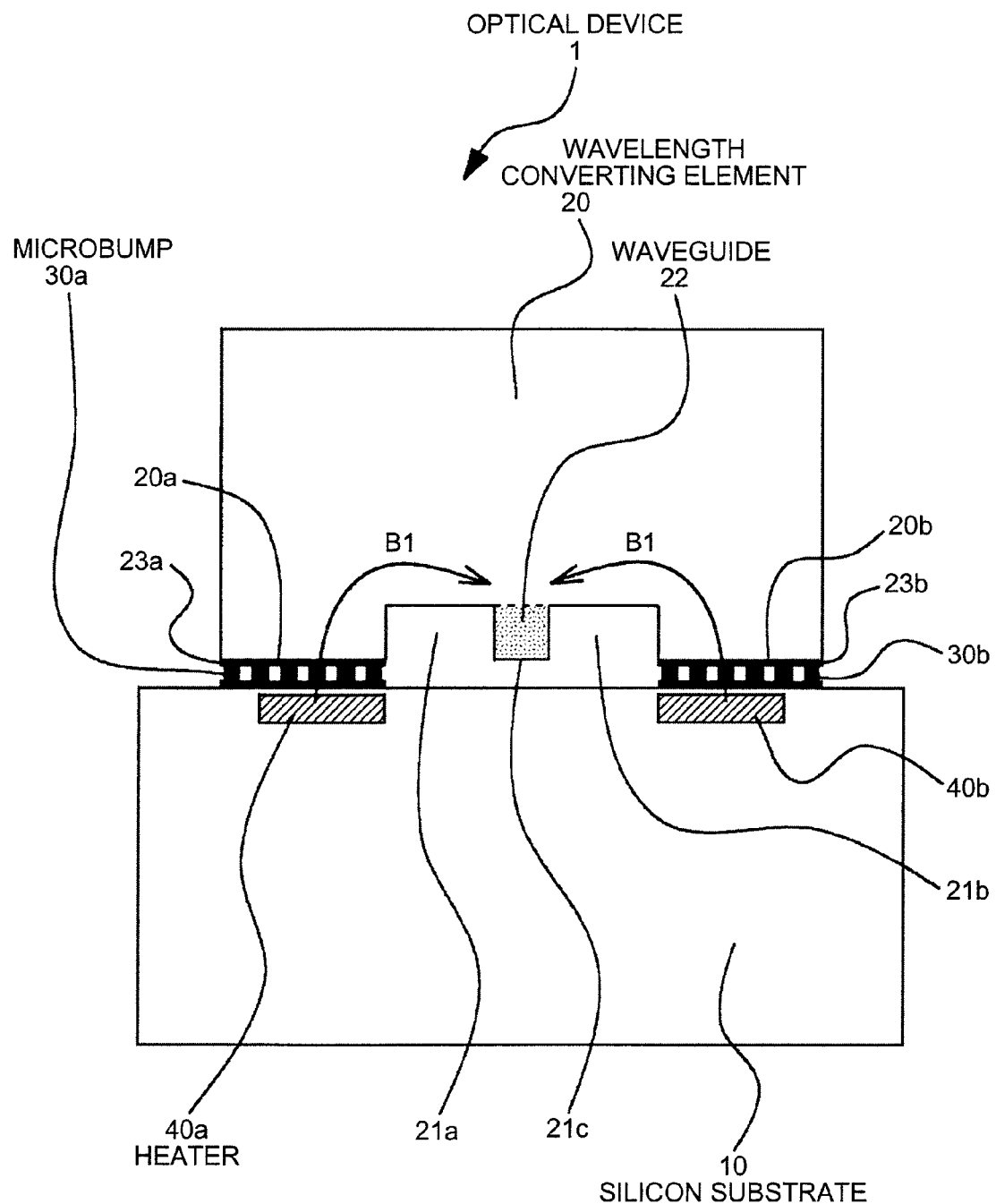
FIG. 1 is a cross sectional view of a first embodiment of the present invention.

Referring to the accompanying drawings, first to fifth embodiments of the present invention will be described in detail.

Characteristics of Each Embodiment

A characteristic of the first embodiment is a mounting of a ridge-type wavelength converting element as an optical element, where heaters that perform temperature adjustment of the wavelength converting element are disposed sandwiching the waveguide of the wavelength converting element. Further, a characteristic of the second embodiment is a mounting of a proton-exchange-type wavelength converting element as an optical element, where heaters that perform temperature adjustment of the wavelength converting element are disposed sandwiching the waveguide of the wavelength converting element.

A characteristic of the third embodiment is a mounting of, as an optical element, a wavelength converting element having a waveguide embedded therein, where a heater that performs temperature adjustment of the wavelength converting element is disposed directly below the waveguide. Further, a characteristic of the fourth embodiment is a mounting of a ridge-type wavelength converting element as an optical element, where heaters that perform temperature adjustment of the wavelength converting element are disposed sandwiching the waveguide of the wavelength converting element and a groove portion is formed in the silicon substrate to prevent heat transfer between the region where the heater is disposed and other regions. A characteristic of the fifth embodiment is a groove portion formed at the wavelength converting element and opposing the groove portion of the silicon substrate, in the configuration of the fourth embodiment.

Description of Overall Configuration of Optical Device: FIG. 3

First, before description of each of the embodiments, an overview of the overall configuration of the optical device according to the present invention will be described using FIG. 3. FIG. 3 is a perspective view depicting an external view of the optical device of the present invention. In FIG. 3, reference numeral 1 is the optical device according to the present invention. The optical device 1 is configured by a plate-shaped silicon substrate 10, a wavelength converting element 20, as an optical element, bonded on the silicon substrate 10, and a semiconductor laser 3 that emits laser light.

Reference numeral 4 is a metal member that is a package member supporting the optical device 1, but for simplicity is depicted here as a plate-shaped metal member. The metal member 4 firmly fixes the silicon substrate 10 and mechanically protects the entire optical device 1 while further having a function as a heat dissipating means of the optical device 1.

Description of Optical Device Operation: FIG. 3

Next, an overview of the operation of the optical device 1 will be described. In FIG. 3, when the semiconductor laser 3 is supplied with a drive current from the silicon substrate 10 by a non-depicted means, a fundamental wave of infrared light (not depicted) is emitted. The infrared light from the semiconductor laser 3 is input to a waveguide 22 (indicated by the dotted line) of the wavelength converting element 20, is converted into harmonic light in the waveguide 22, whereby green-colored laser light or blue-colored laser light L1 is emitted from an emission port 22a of the waveguide 22.

As a concrete example, the semiconductor laser 3 oscillates infrared light having a wavelength of 1064 nm and the wavelength converting element 20 converts the infrared light into green-colored laser light having a wavelength of 532 nm. Alternatively, the semiconductor laser 3 oscillates infrared light having a wavelength of 860 nm and the wavelength converting element 20 converts the infrared light into blue-colored laser light having a wavelength of 430 nm. As a result, the optical device of the present invention can be used in optical source apparatuses such as compact projectors using laser light as an optical source. The external view of the optical device 1 depicted in FIG. 3 is suitable for each of the first to fifth embodiments described hereinafter.

First Embodiment

Figure 2:
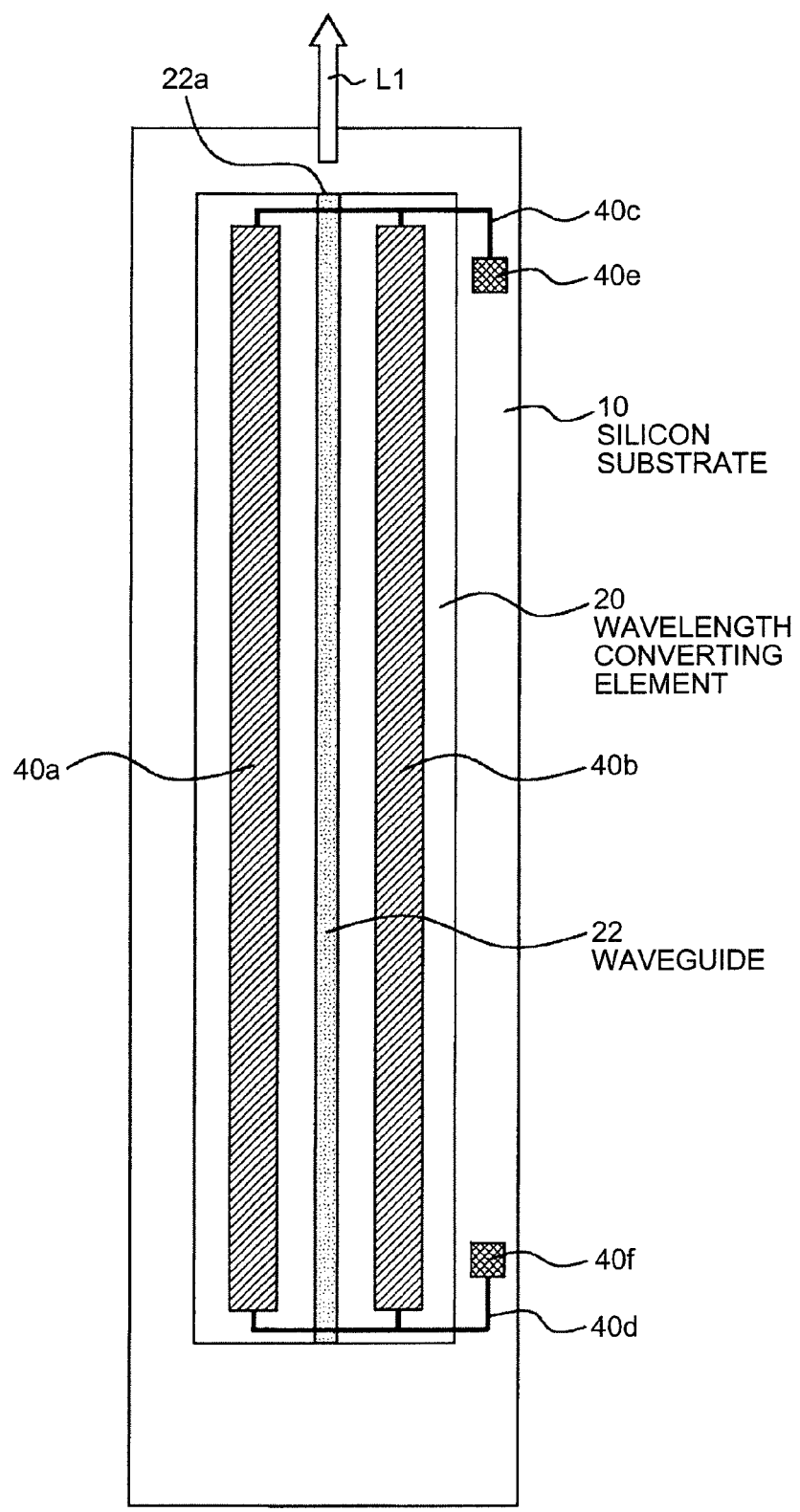
FIG. 2 is a top view of the first embodiment.

General Description of Configuration According to First Embodiment: FIGS. 1, 2

A configuration of the optical device according to the first embodiment will be described using FIGS. 1 and 2. FIG. 1 is a cross sectional view of the first embodiment, schematically depicting a cross section along line A-A' sectioning the optical device 1 as depicted in FIG. 3 described above. Depiction of the metal member 4 is omitted. FIG. 2 is a top view of the first embodiment, schematically depicting the silicon substrate 10 and the wavelength converting element 20 of the optical device 1 in FIG. 3. In the drawing, the semiconductor laser 3, micro bumps 30a, 30b, etc. are omitted. FIG. 2 is described as a transparent view so that the positional relation of the silicon substrate 10 and the wavelength converting element 20 is clear.

In FIG. 1, the wavelength converting element 20 of the optical device 1 that is the first embodiment is a wavelength converting element having a ridge-shape structure of SHG crystal having $LiNbO_3$ as a primary component. At a lower portion of the wavelength converting element 20 and along the length thereof, two recess portions 21a, 21b are formed. The waveguide 22 is formed in a protruding portion 21c between the recess portions 21a, 21b. Since the waveguide 22 is formed between the recess portions 21a, 21b, air layers form the surrounding 3 surfaces and using the difference of the indexes of refraction between the waveguide 22 and the surrounding surfaces, light can be trapped therein. As described above, the waveguide 22 has a function of converting a fundamental wave input thereto from the semiconductor laser 3 (see FIG. 3) into a harmonic and outputting the harmonic. Further, excluding the recess portions 21a, 21b at a lower portion of the wavelength converting element 20, Au thin films 23a, 23b are formed at two planar portions 20a, 20b.

Respectively at positions opposing the planar portions 20a, 20b of the wavelength converting element 20 at an upper portion of the silicon substrate 10, micro bumps 30a, 30b made of Au (gold) having excellent conductivity are formed. Consequently, the micro bumps 30a, 30b on the silicon substrate 10 and the Au films 23a, 23b at a lower portion of the wavelength converting element 20 are bonded at an ambient temperature, bonding the silicon substrate 10 and the wavelength converting element 20. In this manner, the wavelength converting element 20 is mounted to the silicon substrate 10 so that the waveguide 22 faces toward the silicon substrate 10, i.e., the waveguide 22 is in proximity to the silicon substrate 10.

Further, near a surface of the silicon substrate 10 positioned directly below each of the micro bumps 30a, 30b, heaters 40a, 40b are formed that are a temperature adjusting means for the wavelength converting element 20. In other words, the micro bumps 30a, 30b are respectively formed in proximity to and superior to the heaters 40a, 40b, whereby the heaters 40a, 40b and the micro bumps 30a, 30b are disposed near the waveguide 22 of the wavelength converting element 20. The heaters 40a, 40b and the micro bumps 30a, 30b are not formed directly below the waveguide 22, but rather in a region other than that below the waveguide 22.

Consequent to this structure, the heat generated by energizing the heaters 40a, 40b is transferred near the waveguide 22 of the wavelength converting element 20 through the routes indicated by arrows B1 and via the micro bumps 30a, 30b having excellent conductivity, enabling very efficient heating of the waveguide 22 and temperature adjustment. Details concerning the micro bumps 30a, 30b and heaters 40a, 40b will be described hereinafter.

Next, using the top view of FIG. 2, the position relation of the waveguide 22 of the wavelength converting element 20 of the first embodiment and the two rows of heaters 40a, 40b on the silicon substrate 10 will be described. As depicted in FIG. 2, the waveguide 22 is formed along the length of wavelength converting element 20, from one end thereof to the other end thereof. Harmonic laser light L1 is emitted from the emission port 22a at the end of the waveguide 22, depicted at the upper side in the drawing.

The two rows of heaters 40a, 40b are formed near and along both sides of the waveguide 22, so as to sandwich the waveguide 22. As a result, temperature adjustment can be performed that uniformly heats the entire waveguide 22 by the heaters 40a, 40b. Furthermore, the heaters 40a, 40b are connected in parallel by wiring patterns 40c, 40d and are further connected thereby, to electrodes 40e, 40f on the silicon substrate 10. As a result, by applying voltage from an external source to the electrodes 40e, 40f and supplying a given current, the heaters 40a, 40b are heated, enabling temperature adjustment of the waveguide 22 of the wavelength converting element 20.

Thus, the first embodiment can simplify fabrication processes since the silicon substrate 10 and the wavelength converting element 20 are bonded at an ambient temperature by micro bumps made of Au, requiring no application of heat. Further, the two rows of heaters 40a, 40b are disposed sandwiching the waveguide 22 and since the micro bumps 30a, 30b of Au are disposed in proximity to and superior to the heaters 40a, 40b, the heat generated by the heaters 40a, 40b can be efficiently transferred to the waveguide 22 via the micro bumps 30a, 30b, enabling temperature adjustment (temperature control) of the waveguide 22 of the wavelength converting element 20 to be performed.

The first embodiment adopts a configuration that does not dispose the micro bumps and the heaters directly below the waveguide 22. As depicted in FIG. 1, the micro bumps 30a, 30b and the heaters 40a, 40b are formed directly below the planar portions 20a, 20b of the wavelength converting element 20. There are three reasons for this. The first reason is that although the waveguide 22 of the wavelength converting element 20 uses the difference of the indexes of refraction between the waveguide 22 and the surrounding regions (air layers) to trap light in the waveguide 22, if the waveguide 22 comes in direct contact with metal, the difference of the indexes of refraction varies and the waveguide 22 cannot trap light as designed, arising in a problem of drops in the performance of the waveguide 22.

The second reason is that, if the silicon substrate 10 and the wavelength converting element 20 are bonded at an ambient temperature by the micro bumps of Au, although substantial pressure (5-10 kgf/mm$^2$) has to be applied to the silicon substrate 10 and the wavelength converting element 20, if the micro bumps are further provided directly below the waveguide 22, stress is added to the waveguide 22 through the micro bumps, causing distortion of the crystal of the waveguide 22 and arising in a problem of drops in the wavelength conversion efficiency of the waveguide 22.

The third reason is that, among the infrared light emitted from the semiconductor laser 3, if light that is not coupled with the waveguide 22 comes into contact with the waveguide 22 or reaches the micro bumps directly below, heat is generated by the micro bumps. If this heat is transmitted to the waveguide 22, the temperature distribution of the waveguide 22 is affected causing a drop in the conversion efficiency of the wavelength converting element 20. Thus, if metal micro bumps are formed in contact with or directly below the waveguide 22 of the wavelength converting element 20, the waveguide 22 is adversely affected by various factors and the performance of the wavelength converting element 20 drops.

Consequently, to solve these problems, the first embodiment forms the micro bumps 30a, 30b and the heaters 40a, 40b in a region that is away from and not below the waveguide 22 and does not dispose micro bumps or heaters in contact with or directly below the waveguide 22.

Consequently, since the micro bumps do not directly contact the waveguide 22, the difference between the surrounding index of refraction and that of the waveguide 22 does not change, enabling the light to be trapped as designed, whereby performance drops of the waveguide 22 do not occur. Further, even if substantial pressure is applied to bond the silicon substrate 10 and the wavelength converting element 20 at an ambient temperature, since the micro bumps are not directly below the waveguide 22, no stress is added to the waveguide 22 and there is no risk of drops in the wavelength conversion efficiency. Moreover, since the micro bumps are not formed making contact with or directly below the waveguide 22, even if there is light that is not couple with the waveguide 22 among the infrared light emitted from the semiconductor laser 3, the light does not reach the micro bumps because the micro bumps are away from the waveguide 22, and there are no adverse effects on the wavelength converting element 20.

Although not depicted, if an internal heater drive circuit is disposed for driving the heaters 40a, 40b in the silicon substrate 10, the electrodes 40e, 40f connected to the external source are not necessary and both ends of each of the heaters

40a, 40b are connected to the internal heater drive circuit. Further, not only the heater drive circuit, but a circuit driving the semiconductor laser 3 (see FIG. 3) and various other circuits can be fabricated in the silicon substrate 10.

Description of Micro Bump Bonding According to First Embodiment: FIG. 4

Next, the micro bumps bonding the silicon substrate 10 and the wavelength converting element 20 according to the first embodiment will be described using FIGS. 4A and 4B. FIG. 4A is a perspective view of a bonding of the silicon substrate 10 and the wavelength converting element 20 by the micro bumps; FIG. 4B is a side view of the bonding of the silicon substrate 10 and the wavelength converting element 20 by the micro bumps.

In FIG. 4A and FIG. 4B, on an upper surface of the silicon substrate 10, numerous micro bumps 30 made of Au and circularly shaped are formed on an Au thin film. Meanwhile, at a lower surface of the wavelength converting element 20, i.e., on a surface coming into contact with the silicon substrate 10, the Au thin film 23 is formed. In this state, when the wavelength converting element 20 is place on the silicon substrate 10 and pressure, not heat, is applied, the Au becomes activated, bonding the silicon substrate 10 and the wavelength converting element 20 at an ambient temperature (ambient temperature bonding). As one example, the diameter of the micro bump 30 is on the order of 5 µm, while the height is on the order of 1 µm.

Thus, since bonding by the Au micro bumps requires no application of heat, fabrication processes can be simplified. Furthermore, with concern of errant positioning occurring of the silicon substrate 10 and the wavelength converting element 20 consequent to the application of heat, the silicon substrate 10 and the wavelength converting element 20 can be bonded with high precision. In addition, the thermal conductivity of the Au micro bumps 30 is approximately 320 W/(m·K) and since heat is transferred extremely easily, the heat from the heaters 40a, 40b (see FIG. 1) formed in the silicon substrate 10 is efficiently transferred to the wavelength converting element 20.

Figure 5A:
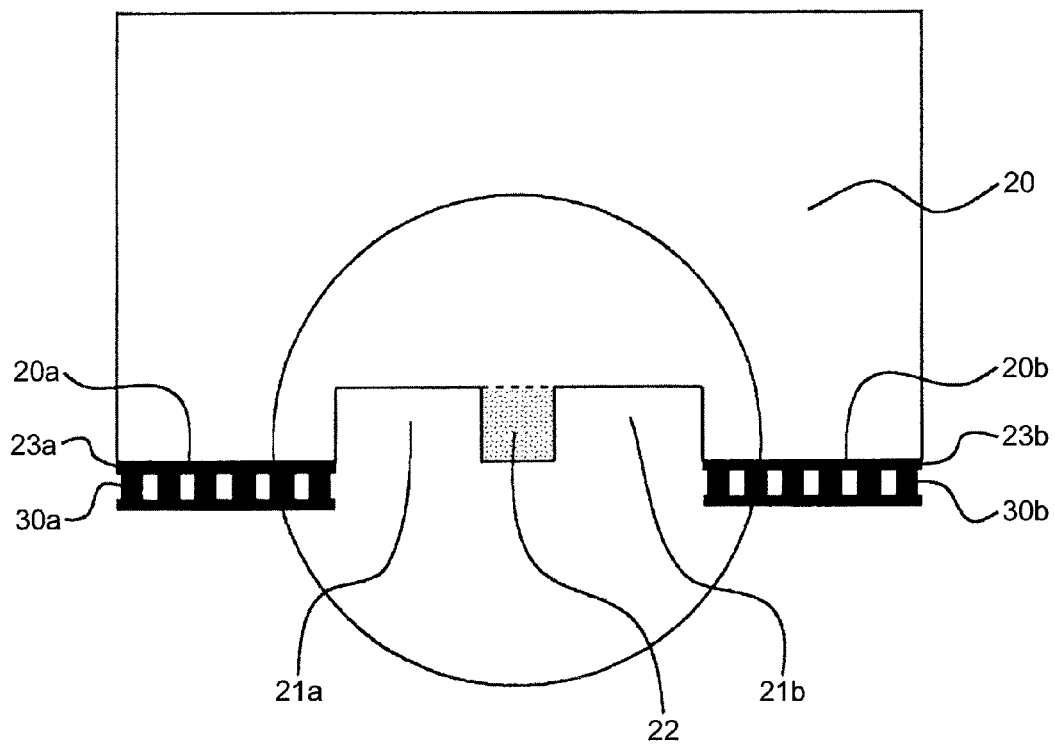
FIGS. 5A and 5B are cross sectional views of a detailed configuration example of a wavelength converting element of the first embodiment.
Figure 5B:
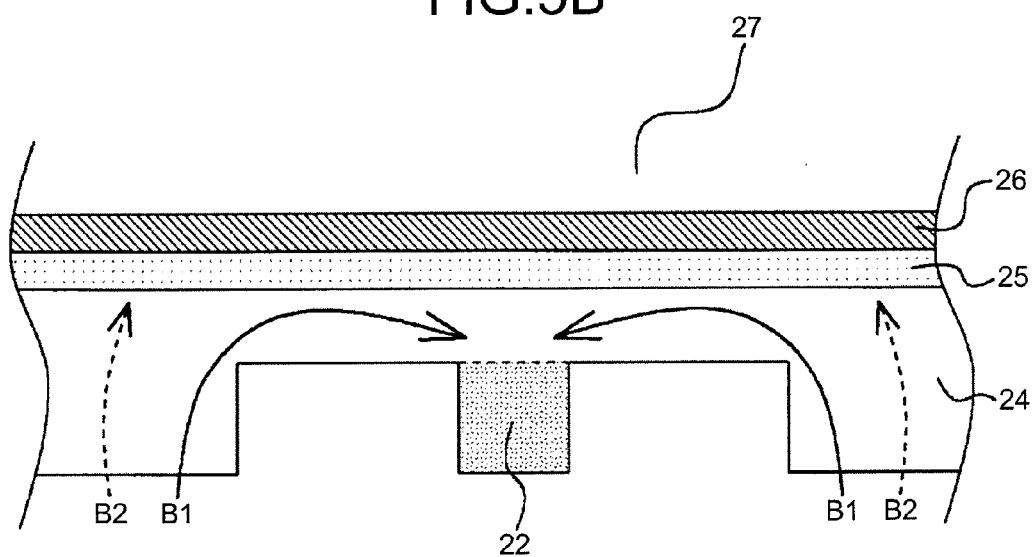

Detailed Description of Wavelength Converting Element According to First Embodiment: FIGS. 5A, 5B Next, a detailed example of a configuration of the wavelength converting element 20 according to the first embodiment will be described using FIGS. 5A and 5B. FIG. 5A is a cross sectional view of the wavelength converting element 20 and micro bumps 30a, 30b, schematically depicting a cross section along the line A-A' sectioning the optical device 1 as depicted in FIG. 3 and FIG. 5B is an enlarged cross sectional view of the wavelength converting element 20 surrounding the waveguide 22 (portion encircled in FIG. 5A). In FIGS. 5A and 5B, at a lower portion of the wavelength converting element 20, as described above, the two recess portions 21a, 21b are formed and the waveguide 22 is formed between the recess portions 21a, 21b. Further, at the planar portions 20a, 20b at a lower portion of the wavelength converting element, the Au thin films 23a, 23b and the micro bumps 30a, 30b that bond the silicon substrate 10 (see FIG. 1) are formed.

Here, as depicted in the enlarged cross sectional view, the wavelength converting element 20 has a layered structure. The lowermost layer of the wavelength converting element 20 and including the waveguide 22 is a wavelength converting layer 24, made of MgO doped $LiNbO_3$ or the like. At an upper portion of the wavelength converting layer 24, a cladding layer 25 is formed. The cladding layer 25 is made of $SiO_2$ or SiNOx (silicon oxynitride), etc. having a lower index of refraction than the wavelength converting layer 24. An upper portion of the cladding layer 25, a transparent electrode film layer 26 is formed of ITO, InTiOx, SnO, ZnO, etc. At an upper portion of the transparent electrode film layer 26 is a base substrate 27 made of $LiNbO_3$ or Si, etc. Provided there is no influence on the waveguide 22, the layer sequence is not limited hereto.

Here, the wavelength converting layer 24 and the base substrate 27 involved in wavelength conversion are thermally insulated by the cladding layer 25, forming a configuration where heat from the micro bumps 30a, 30b at a lower portion of the wavelength converting element 20 is transferred to waveguide 22 through the wavelength converting layer 24 (solid arrow B1), but is not easily transferred to the base substrate 27 (dotted arrow B2). In other words, the thermal conductivity of the $SiO_2$ of the cladding layer 25 is as low as approximately 1 W/(m·K) and consequently, the heat from the heaters 40a, 40b (see FIG. 1) of the silicon substrate 10 is blocked and does not escape into the base substrate 27.

Further, the transparent electrode film layer 26 is a poling electrode for forming a periodic poling structure for converting the wavelength of light in the waveguide 22. The transparent electrode film layer 26 has a further role of a heat reflecting film that does not absorb infrared rays. In this manner, since the wavelength converting element 20 has a layered structure, the heat from the heaters 40a, 40b (see FIG. 1) flows easily to the wavelength converting layer 24, and the wavelength converting layer 24, which is involved in wavelength conversion, can be efficiently heated alone.

Figure 6:
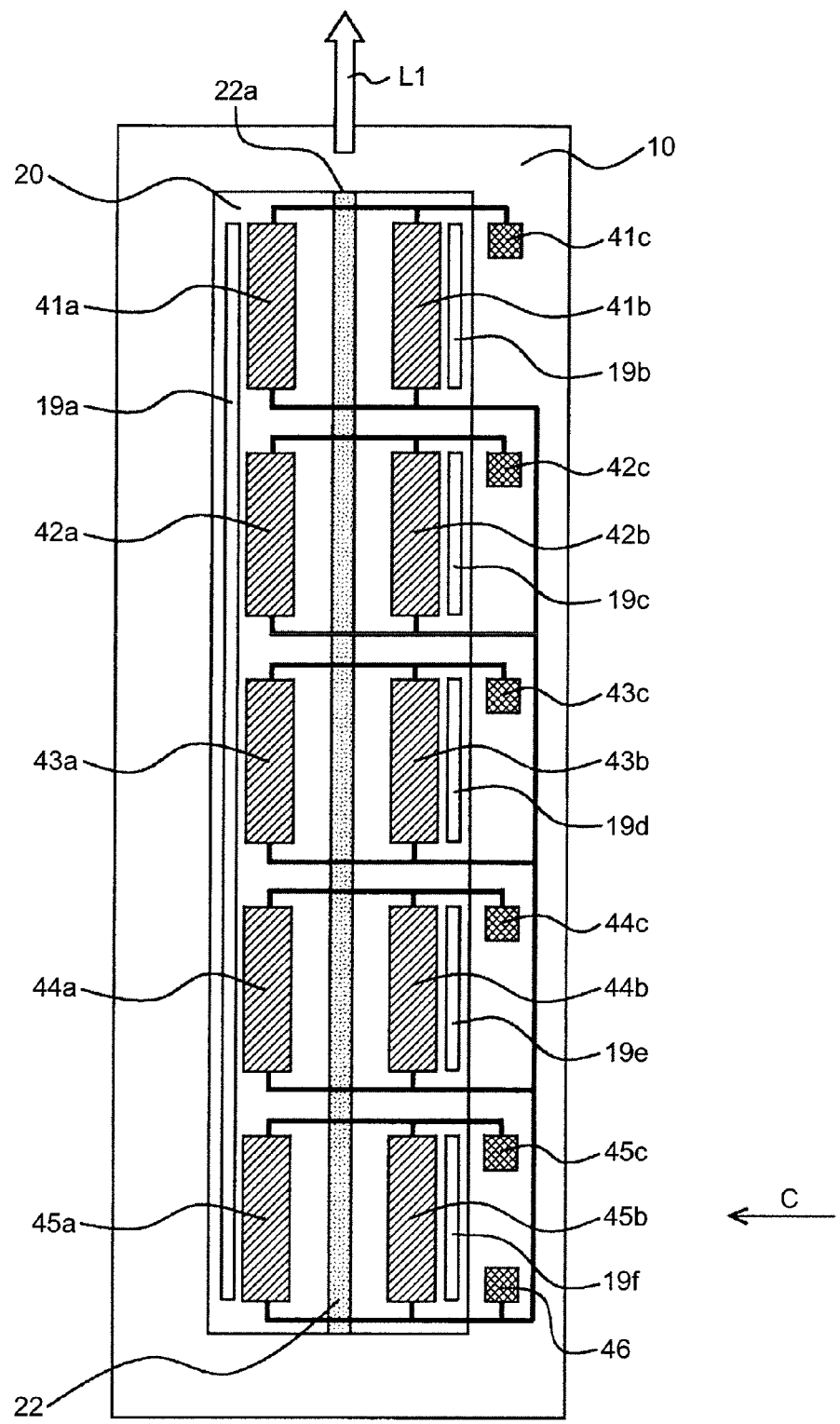
FIG. 6 is a top view of a configuration example of a separated-type heater of the first embodiment.

Description of Separated-Type Heater Structure of First Embodiment: FIG. 6

Next, an example of a configuration where the heater formed in the silicon substrate 10 of the first embodiment is separated into plural heaters will be described using FIG. 6. FIG. 6 is a top view schematically depicting the silicon substrate 10 and the wavelength converting element 20 of the optical device 1 depicted in FIG. 3. In the drawing, depiction of the semiconductor laser and of the micro bumps, etc. is omitted. FIG. 6 is described as a transparent view so that the positional relation of the silicon substrate 10 and the wavelength converting element 20 is clear.

In FIG. 6, similar to FIG. 2, the wavelength converting element 20 includes the waveguide 22, where a fundamental wave from a non-depicted semiconductor laser is converted into a harmonic and the laser light L1 is emitted from the emission port 22a at the end of the waveguide 22, depicted at the upper side in the drawing.

Meanwhile, although the two rows of heaters formed in the silicon substrate 10 are formed near and along both sides of the waveguide 22 so as to sandwich the waveguide 22, as depicted, the heater is formed separated into plural heaters along the length of the silicon substrate 10. In other words, a set of 5 groups of heaters in two rows are formed along the length, from a side near the emission port 22a of the waveguide 22, as heaters 41a and 41b, heaters 42a and 42b, heaters 43a and 43b, heaters 44a and 44b, and heaters 45a and 45b. In the description hereinafter, when indicating the heaters as a whole, heaters 41-45 will be used.

The heaters 41-45 are connected to independent electrodes and to a common electrode, and can be independently heated by energizing from an external source. In other words, the heaters 41a, 41b are connected in parallel, where one terminal is connected to an electrode 41c and the other terminal is connected to a common electrode 46. Similarly, for the other groups of heaters 42-45, one terminal is connected to electrodes 42c-45c, respectively and the other terminal is connected to the common electrode 46.

Thus, since the heaters 41-45 are separated and can be energized independently, independent temperature adjustment can be performed according to the state in each zone. For example, since the heaters 41a, 41b are near the emission port 22a from which the laser light L1 is emitted, if the temperature of external air is low, the current to the heaters 41a, 41b is increased, thereby increasing the amount of heat to be applied to heat the portion of the waveguide 22 in that zone. Further, since the heaters 45a, 45b at the lower portion of the drawing are the farthest from external air, control is performed to reduce the current supplied to the heaters 45a, 45b to reduce the amount of heat to be applied, enabling implementation of precise temperature adjustment according to state, in each zone.

In FIG. 6, although the heater is depicted to be separated into five groups, configuration is not limited hereto and the separation count can be arbitrarily set according to the state. Further, in FIG. 6, reference numerals 19a-19f indicate groove portions formed in the silicon substrate 10 and will be described hereinafter.

The separated-type heater structure described in FIG. 6 is similarly applicable to the second to the fifth embodiments described hereinafter.

Figure 7:
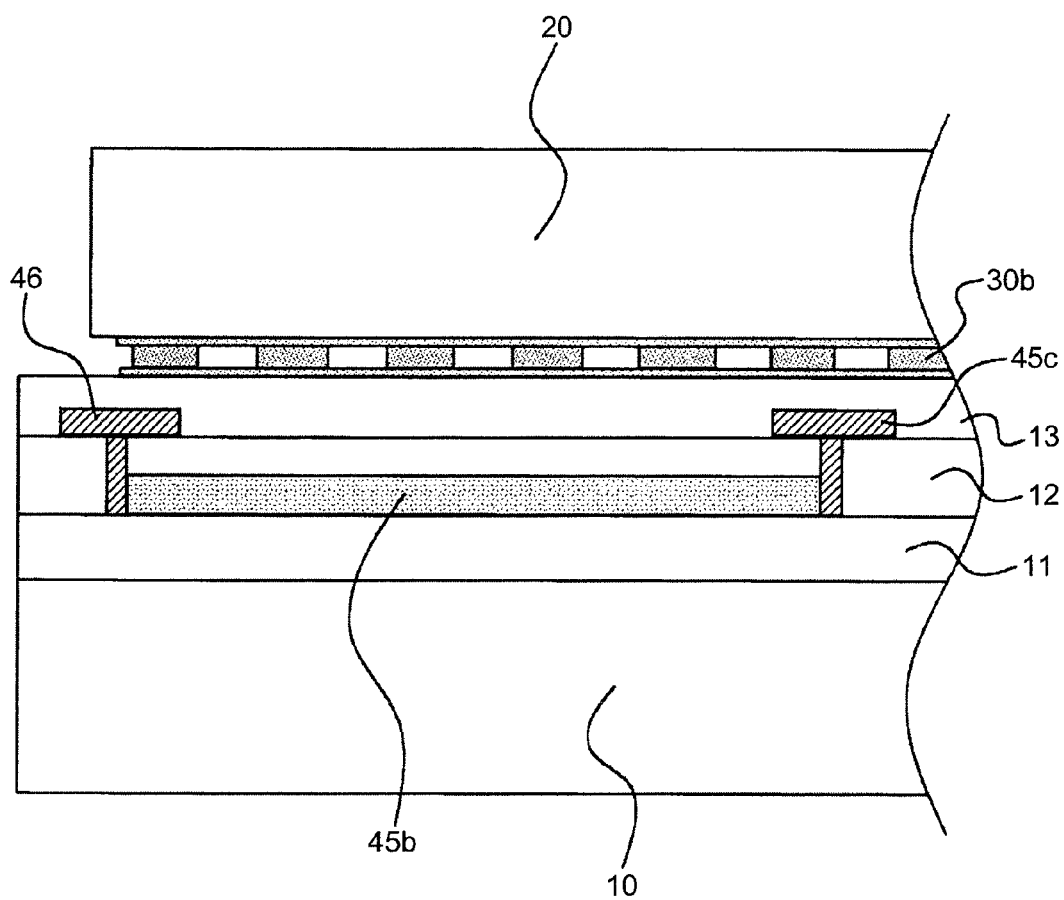
FIG. 7 is an enlarge view of an example of an internal structure of the heater of the first embodiment.

Description of Internal Structure of Heater of Silicon Substrate of First Embodiment: FIG. 7

Next, an example of the internal structure of the heater formed on the silicon substrate 10 of the first embodiment will be described using FIG. 7. FIG. 7 is an enlarged view of the heater 45b surroundings including the silicon substrate 10 and the wavelength converting element 20 depicted FIG. 6, as viewed from the direction indicated by arrow C. In FIG. 7, although the internal structure of the heater will be described taking a separated heater 45b as an example, the other separated heaters and the heaters 40a, 40b depicted in FIG. 2 have a similar structure.

In FIG. 7, the heater 45b is formed near a surface of the silicon substrate 10. In other words, on a surface of the silicon substrate 10, firstly, an insulation film 11 is formed. Next, on a surface of the insulation film 11, the heater 45b is formed. The heater 45b is covered by an insulation film 12. At the ends of the heater 45b, the electrode 45c for connection to an external source and the common electrode 46 are formed and are electrically connected to the heater 45b. On the insulation film 12, a protective film 13 for protecting the heater 45b is formed.

Material such as silicon oxide and siliconized glass is used for the insulation films 11, 12 and the protective film 13. Further, as the heater 45b, resistors such a diffusion resistor that can be prepared by a semiconductor process, a polycrystalline silicon resistor, and a resistor of metal wiring is used. Al, Si doped Al, Si—Cu doped Al, for example, is used for the metal wiring.

Here, if a given voltage is applied between the electrode 45c and the common electrode 46, current flows in the heater 45b and Joule heat is generated, heating the surroundings of the heater 45b. Here, as depicted in the drawing, since the micro bumps 30b are disposed on an upper portion of the heater 45b, heat from the heater 45b is efficiently transferred to the micro bumps 30b, enabling the wavelength converting element 20 to be heated. In this manner, since the heater 45b can be formed by a semiconductor process anywhere on the surface of the silicon substrate 10, not only is space saved but also the heater 45b can be disposed directly below the area intended to be heated, enabling efficient heating.

The micro bump structure, the detailed wavelength converting element configuration, separated-type heater, and the internal heater structure depicted in FIGS. 4 to 7, are not only applicable to the first embodiment, but are also applicable to the optical device of the second to the fifth embodiments described hereinafter.

Description of Heating Simulation in First Embodiment

Next, to make the effects of the present invention clear, the inventor implemented a heating simulation by the heater based on the first embodiment and the results will be described. As simulation conditions, centered about the waveguide 22 of the optical device 1 depicted in FIG. 1, the wavelength converting element 20, the silicon substrate 10, the micro bump 30b, and the heater 40b in the upper right portion of the drawing were used to perform the simulation.

Conditions for each component: for the wavelength converting element 20, material: $LiNbO_3$ (MgO Doped) and thermal conductivity: 3.9 W/(m·K); for the ridge-shape, depth: 2 μm and width: 8 μm; for the waveguide 22 shape, 2 μm×2 μm; for the micro bump 30b, material: Au, shape: diameter: 5 μm, thermal conductivity: 398 W/(m·K); for the silicon substrate 10, thermal conductivity: 163 W/(m·K); and for the heater 40b, size: 20 μm×0.5 μm×10 μm and amount of generated heat: 5 mW.

As a result of simulation under the conditions above, the waveguide 22 surroundings were heated to a temperature of 31-32 degrees C. through the heating by the heater 40b. Consequently, it can be understood that through the micro bumps 30a, 30b made of Au, the heat of the heater 40a, 40b is transferred to the surroundings of the waveguide 22 of the wavelength converting element 20 very efficiently.

In FIG. 1, as an example, the heaters 40a, 40b is formed below the micro bumps 30a, 30b, however, in addition to this configuration, the heaters 40a, 40b and the micro bumps 30a, 30b may be staggered. Similarly, in the second to the fifth embodiments hereinafter, the heaters 40a, 40b and the micro bumps 30a, 30b may be staggered.

Second Embodiment

Description of Overview of Configuration of Second Embodiment: FIG. 8

Next, an overview of a configuration of the optical device of the second embodiment will be described using FIG. 8. The basic structure of the optical device of the second embodiment is similar to that of the optical device 1 of the first embodiment and therefore, identical components are given the same reference numerals and overlapping description is omitted hereinafter. However, concerning the wavelength converting element of the second embodiment, the scheme of forming the waveguide differs from that of the first embodiment and therefore, the reference numeral thereof will be changed and description given.

FIG. 8 is a cross sectional view of the second embodiment, schematically depicting a cross section along line A-A' sectioning the optical device 1 as depicted in FIG. 3. Depiction of the metal member 4 is omitted. A top view of the second embodiment is similar to FIG. 2, a top view of the first embodiment and therefore, depiction thereof is omitted herein.

In FIG. 8, the wavelength converting element 50 of the optical device 1 of the second embodiment is a proton-exchange-type wavelength converting element of SHG-crystal having $LiNbO_3$ as a primary component. At a substantially center portion of a lower portion of the wavelength converting element 50, the waveguide 51 is formed by proton exchange. As described above, the waveguide 51 has a function of converting into a harmonic, the fundamental wave input thereto from the semiconductor laser 3 (see FIG. 3) and emitting the harmonic. Further, in a region other than that below the waveguide 51 at a lower plane of the wavelength converting element 50, i.e., in the drawing, at regions that are below and, to the left or to the right of the waveguide 51, Au thin films 23a, 23b are formed sandwiching the waveguide 51.

At a position opposing the Au thin films 23a, 23b of wavelength converting element 50 described above, at an upper portion of the silicon substrate 10, micro bumps 30a, 30b made of Au are formed. Consequently, the micro bumps 30a, 30b of the silicon substrate 10 and the Au films 23a, 23b at the lower portion of the wavelength converting element 50 are bonded at an ambient temperature, bonding the silicon substrate 10 and the wavelength converting element 50. As a result, the wavelength converting element 50 is mounted to the silicon substrate 10, with the waveguide 51 in proximity of the silicon substrate 10.

Further, near a surface of the silicon substrate 10, positioned directly below each of the micro bumps 30a, 30b, the heaters 40a, 40b that adjust the temperature of the wavelength converting element 50 are formed, disposed in two rows, sandwiching the waveguide 51. In other words, similar to the first embodiment, the micro bumps 30a, 30b are respectively formed in proximity to and superior to the heaters 40a, 40b and consequently, the heaters 40a, 40b and the micro bumps 30a, 30b are disposed near the waveguide 51 of the wavelength converting element 50.

Consequent to this structure, the heat generated by energizing the heaters 40a, 40b is transferred near the waveguide 51 of the wavelength converting element 50 through the routes indicated by arrows B3 and via the micro bumps 30a, 30b having excellent conductivity, enabling very efficient heating of the waveguide 51 and temperature adjustment. Although not depicted, if the wavelength converting element 50 has a layered structure like the aforementioned first embodiment, the heat from the heaters 40a, 40b can efficiently heat the wavelength converting layer alone.

Thus, in the second embodiment, the wavelength converting element 50 forms the waveguide 51 by proton exchange and similar to the first embodiment, the heaters 40a, 40b are disposed in two rows, sandwiching the waveguide 51. Further, since the Au micro bumps 30a, 30b are disposed in proximity to and superior to the heaters 40a, 40b, the second embodiment can efficiently transfer to the waveguide 51 via the micro bumps 30a, 30b, the heat generated by the heaters 40a, 40b and can perform temperature adjustment. Moreover, since the micro bumps 30a, 30b and the heaters 40a, 40b are not disposed directly below the waveguide 51, but rather in a region other than that below the waveguide 51, similar to the first embodiment, waveguide performance drops occurring from the micro bumps making contact with the waveguide can be prevented.

Third Embodiment

Figure 9A:
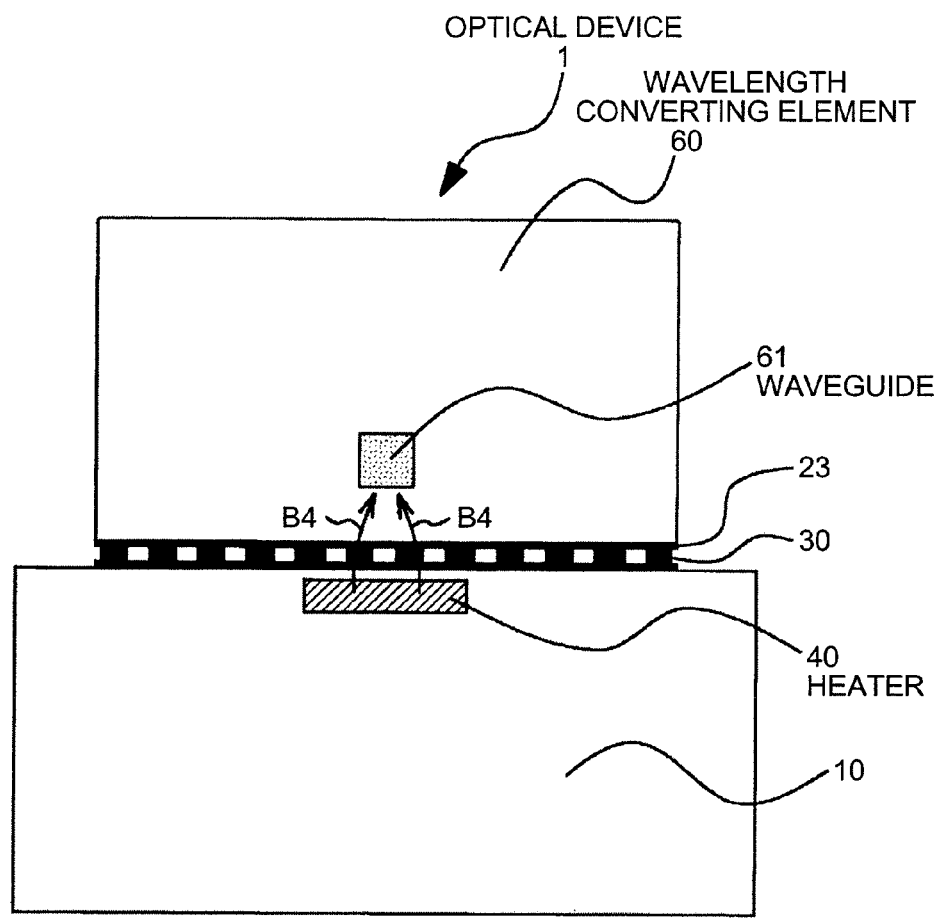
FIGS. 9A and 9B are cross sectional views of the optical device of a third embodiment of the present invention.
Figure 9B:
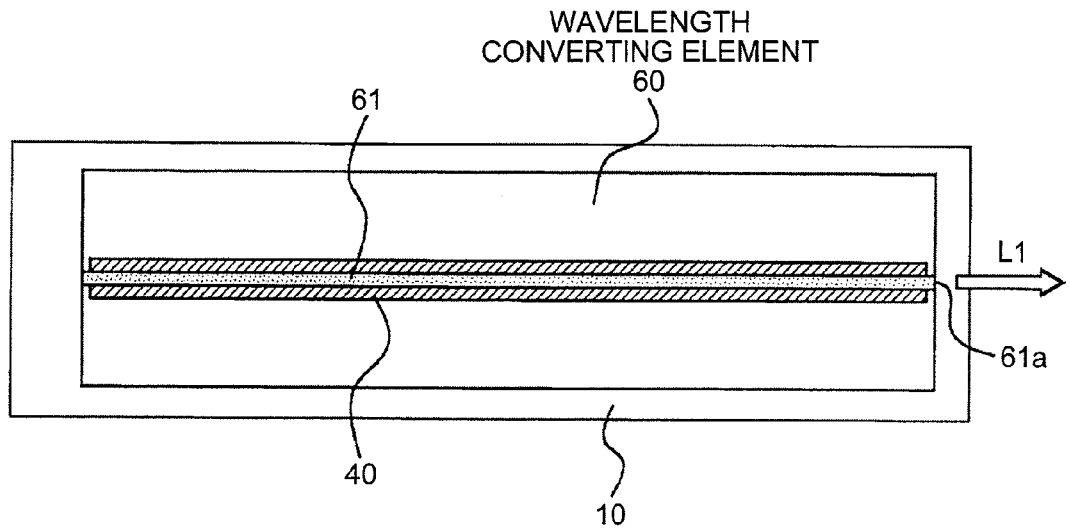

Description of Overview of Configuration of Third Embodiment: FIGS. 9A, 9B

Next, an overview of a configuration of the optical device of the third embodiment will be described using FIGS. 9A and 9B. The basic structure of the optical device of the third embodiment is similar to that the first embodiment and therefore, identical components are given the same reference numerals and overlapping description is omitted hereinafter. However, concerning the wavelength converting element of the third embodiment, the scheme of forming the waveguide differs from that of the first embodiment and therefore, the reference numeral thereof will be changed and description given.

FIG. 9A, is a cross sectional view of the third embodiment, schematically depicting, like the first embodiment, a cross section along line A-A' sectioning the optical device 1 as depicted in FIG. 3 described above. Depiction of the metal member 4 is omitted. FIG. 9B is a top view of the third embodiment, schematically depicting the optical device 1 in FIG. 3 and omitting the semiconductor laser and the electrodes. FIG. 9B is described as a transparent view so that the positional relation among the components is clear.

In FIG. 9A, the wavelength converting element 60 of the optical device 1 of the third embodiment is a waveguide-embedded-type wavelength converting element of SHG-crystal having $LiNbO_3$ as a primary component. The wavelength converting element 60 can be fabricated by forming a non-depicted cladding layer of a given thickness at a lower portion of the ridge-type wavelength converting element 20 (see FIG. 1) depicted in the first embodiment. Consequently, the waveguide 61 is formed being embedded inside the wavelength converting element 60. Further, at an entire lower plane of the wavelength converting element 60, an Au thin film 23 is formed.

At a position opposing the Au thin film 23 of the wavelength converting element 60 described above, at an upper portion of the silicon substrate 10, micro bumps 30 made of Au are formed. Consequently, the micro bumps 30 on the silicon substrate 10 and the Au thin film 23 at a lower portion of the wavelength converting element 60 are bonded at an ambient temperature, bonding the silicon substrate 10 and the wavelength converting element 60. Here, since the waveguide 61 is embedded inside the wavelength converting element 60 as described above, the Au thin film 23 and the micro bumps 30 cover the entire lower surface of the wavelength converting element 60 and even if the Au thin film 23 and the micro bumps 30 are formed directly below the waveguide 61, the waveguide 61 does not make direct contact with the metal film and thus, there is no concern of drops in the performance of the waveguide 61.

Further, near a surface of the silicon substrate 10, positioned directly below the micro bumps 30, a heater 40 that adjusts the temperature of the wavelength converting element 60 is disposed in one row. The heater 40 is in proximity of the micro bumps 30 and disposed to be positioned directly below the waveguide 61 embedded in the wavelength converting element 60. In other words, the heater 40 and the micro bumps 30 are disposed in proximity to and directly below the waveguide 61 of the wavelength converting element 60.

Consequent to this structure, the heat generated by energizing the heater 40 is transferred to waveguide 61 of the wavelength converting element 60, via the micro bumps 30 and through the routes indicated by arrows B4, enabling very efficient heating of the waveguide 61 and temperature adjustment.

In other words, in the wavelength converting element 60 of the third embodiment, since the waveguide 61 is embedded internally, the micro bumps 30 bonding the wavelength converting element 60 and the silicon substrate 10 do not need to be positioned to avoid the waveguide 61 and can be formed directly below the waveguide 61. Also, since the heater 40 of the silicon substrate 10 can be disposed in proximity to the micro bumps 30 and positioned directly below the waveguide 61, the heat from the heater 40 can reach the waveguide 61 by the shortest route (arrows B4), whereby the third embodiment can implement very efficient heating of the waveguide 61.

Next, the positional relation of the waveguide 61 of the wavelength converting element 60 and the heater 40 of the silicon substrate 10 will be described using the top view depicted in FIG. 9B. In FIG. 9B, the waveguide 61 is formed along the length of the wavelength converting element 60, from one end thereof to the other end thereof. The harmonic laser light L1 is emitted from the emission port 61a at the end of the waveguide 61, depicted on the right side in the drawing.

The heater 40 is formed along the length of and directly below the waveguide 61. As a result, temperature adjustment can be performed that uniformly heats the entire waveguide 61 by the heater 40. Furthermore, although the heater 40 is connected to a wiring pattern and electrodes, configuration is similar to that of the first embodiment (FIG. 2) and therefore, not depicted. In the present embodiment, the heater 40 disposed in one row. This is because the heater 40 can be disposed directly below the waveguide 61, whereby a configuration of one row of the heater can sufficiently heat the waveguide 61. Further, the heater 40 may be a separated-type heater as depicted in FIG. 6 described above.

Thus, the optical device 1 of the third embodiment uses an embedded-type wavelength converting element 60, whereby the micro bumps 30 and the heater 40 are disposed directly below the waveguide 61, enabling the optical device 1 of the third embodiment to efficiently transfer the heat from the heater 40 by the shortest route and via the micro bumps 30 and to further adjust the temperature of the waveguide 61. Furthermore, since the waveguide 61 is embedded inside the wavelength converting element 60, even if the micro bumps 30 are positioned directly below the waveguide 61, the micro bumps 30 do not make contact with the waveguide 61 and the Au thin film 23, enabling a high performance optical device to be provided, without drops in the performance of the waveguide 61.

Fourth Embodiment

Figure 10A:
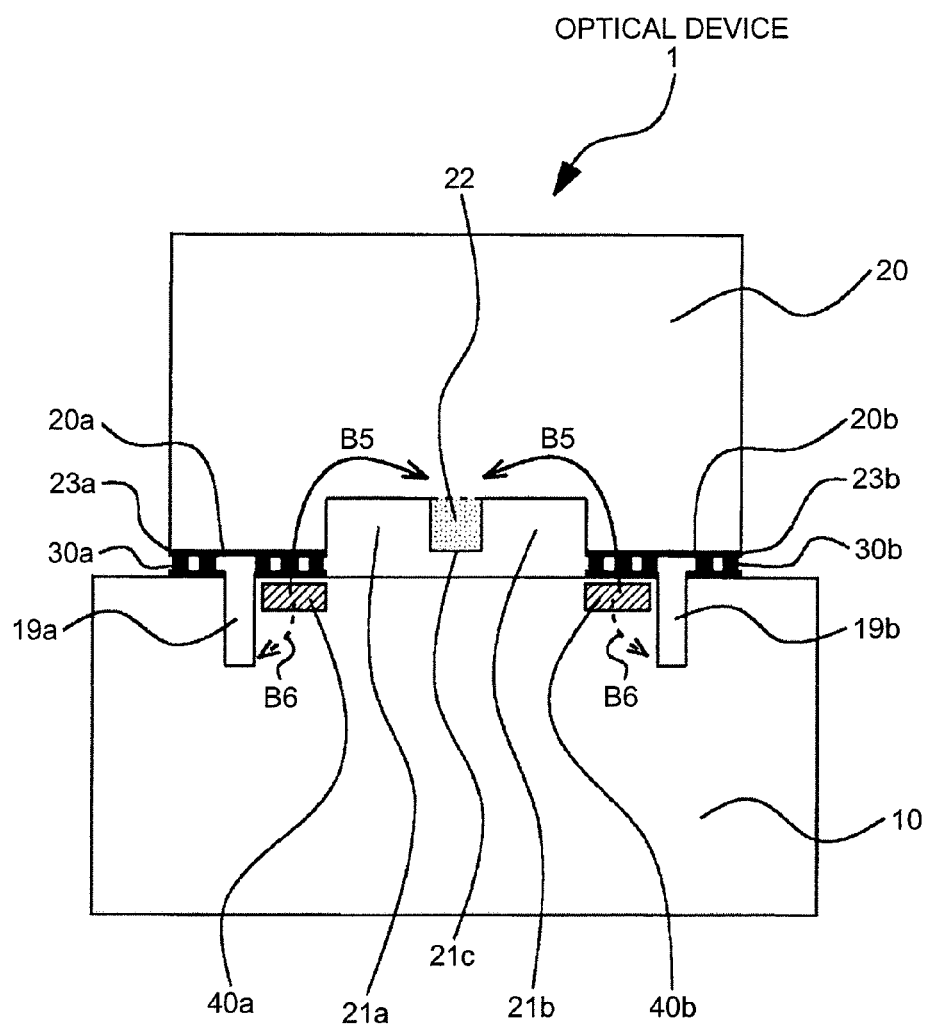
FIGS. 10A and 10B are cross sectional views of the optical device of a fourth embodiment of the present invention.
Figure 10B:
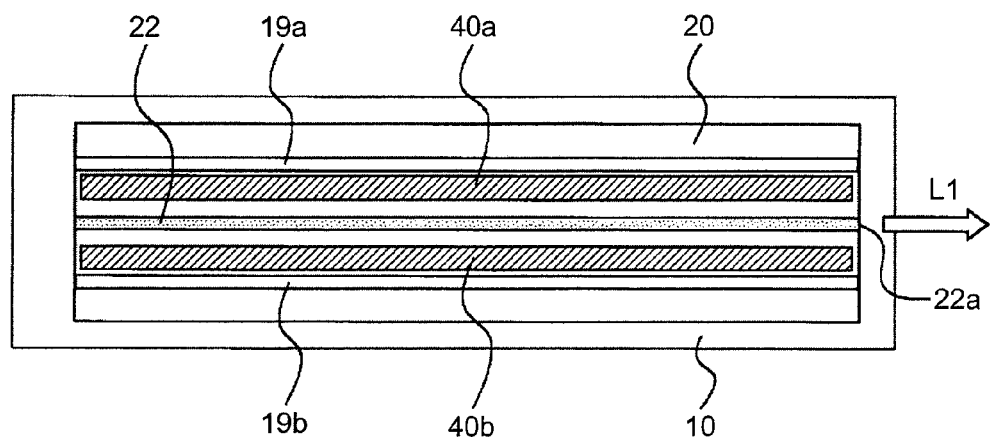

Description of Overview of Configuration of Fourth Embodiment: FIGS. 10A, 10B

Next, an overview of a configuration of the optical device of the fourth embodiment will be described using FIGS. 10A and 10B. The basic structure of the optical device of the fourth embodiment is similar to that of the first embodiment and therefore, identical components are given the same reference numerals and overlapping description is omitted hereinafter. FIG. 10A is a cross sectional view of the fourth embodiment, schematically depicting, like the first embodiment, a cross section along line A-A' sectioning the optical device 1 as depicted in FIG. 3 described above. Depiction of the metal member 4 is omitted. FIG. 10B is a top view of the fourth embodiment, schematically depicting the optical device 1 in FIG. 3 and omitting the semiconductor laser and the electrodes. FIG. 10B is described as a transparent view so that the positional relation among the components is clear.

In FIG. 10A, wavelength converting element 20 is a wavelength converting element having a ridge-shape structure, similar to the first embodiment (see FIG. 1). At a lower portion of the wavelength converting element 20, the two recess portions 21a, 21b are formed. The waveguide 22 is formed in the protruding portion 21c between the recess portions 21a, 21b. Further, excluding the recess portion 21a, 21b of the wavelength converting element 20, the Au thin films 23a, 23b are formed at the planar portions 20a, 20b.

At positions opposing the planar portions 20a, 20b of the wavelength converting element 20 at an upper portion of the silicon substrate 10 and described above, the micro bumps 30a, 30b made of Au are respectively formed. Consequently, the micro bumps 30a, 30b of the silicon substrate 10 and the Au films 23a, 23b at a lower portion of the wavelength converting element 20 are bonded at an ambient temperature, bonding the silicon substrate 10 and the wavelength converting element 20.

Further, near a surface of the silicon substrate 10, positioned directly below each of the micro bumps 30a, 30b, the heaters 40a, 40b that adjust the temperature of the wavelength converting element 20 are formed. In other words, the micro bumps 30a, 30b are formed in proximity to and superior to the heaters 40a, 40b and consequently, the heaters 40a, 40b and the micro bumps 30a, 30b are disposed near the waveguide 22 of the wavelength converting element 20.

Groove portions 19a, 19b are formed in a surface of the silicon substrate 10, at the external side of the heaters 40a, 40b. In other words, the groove portion 19a is formed in a region on the external side of and along the heater 40a, while the groove portion 19b is formed in a region on the external side of and along the heater 40b. The groove portions 19a, 19b, as one example, have a width of approximately 30 μm and a depth of approximately 200 μm. The groove portions 19a, 19b are formed with a purpose of preventing the transfer of heat between the region where the heaters 40a, 40b are disposed and other regions.

The top view depicted in FIG. 10B clearly depicts the positional relation of the waveguide 22, the heaters 40a, 40b, and the grooves 19a, 19b. In other words, in FIG. 10B, the waveguide 22 of the wavelength converting element 20 is formed along the length of the wavelength converting element 20, from one end thereof to the other end thereof. The harmonic laser light L1 is emitted from the emission port 22a at the end of the waveguide 22, depicted on the right side in the drawing. The two rows of heaters 40a, 40b are formed near and along both sides of the waveguide 22, so as to sandwich the waveguide 22. The two rows of groove portions 19a, 19b are formed along the length of and in proximity to the external sides of the two rows of heaters 40a, 40b, so as to sandwich the heaters 40a, 40b.

Consequent to this structure, diffusion of the heat from the heaters 40a, 40b is hindered by the groove portions 19a, 19b formed in proximity to the heaters 40a, 40b (direction indicated by dotted arrow B6 in FIG. 10A), whereby the heat is concentrated at and transferred near the waveguide 22, which is the region intended for heating (direction indicated by solid arrow B5 in FIG. 10A).

Description of Heating Simulation in Fourth Embodiment

Next, to make clear, the effects of the groove portions formed in the silicon substrate 10 and a characteristic of the fourth embodiment, the results of a heating simulation by the heater based on the fourth embodiment will be described. As simulation conditions, although similar to the conditions of the simulation based on the first embodiment described above, for the simulation in the fourth embodiment, a condition of the groove portion 19b (see FIG. 10A) having a width of 30 μm, a depth of 200 μm and formed in the silicon substrate 10 was added and simulation performed.

As a result of simulation under the conditions above in the fourth embodiment, a vicinity of the waveguide 22 was heated to a temperature of 41-43 degrees C. through the heating by the heater 40b. Consequently, the simulation results of the fourth embodiment (with groove portions) increased the temperature of the vicinity of the waveguide 22 by approximately 10 degrees C. more than the simulation results of the first embodiment (without groove portions). This result confirms that the groove portions 19a, 19b of the silicon substrate 10 in the fourth embodiment have a large effect on preventing diffusion of the generated heat from the heater.

Thus, the fourth embodiment can efficiently perform temperature adjustment of the waveguide 22 by preventing diffusion of the heat generated by the heaters 40a, 40b, since the groove portions 19a, 19b are formed on the silicon substrate 10, with a purpose of preventing a transfer of heat between the region where the heater is disposed and other regions. Further, since the generated heat from the heaters 40a, 40b does not easily diffuse into the silicon substrate 10, the heat of the heaters can be prevented from adversely affecting the semiconductor (not depicted) formed on the silicon substrate 10. The groove portions may be a through hole in a portion of the silicon substrate 10.

If the heater that adjusts the temperature of the waveguide 22 is a separated-type as depicted in FIG. 6 described above, the groove portion on the heater 41a-45a side forms the groove portion 19a disposed continuously along the heaters 41a-45a as depicted in the drawing and the other groove portion on the heater 41b-45b side is preferably formed as the separate groove portions 19b-19f, avoiding the wiring pattern as depicted in the drawing.

Fifth Embodiment

Figure 11:
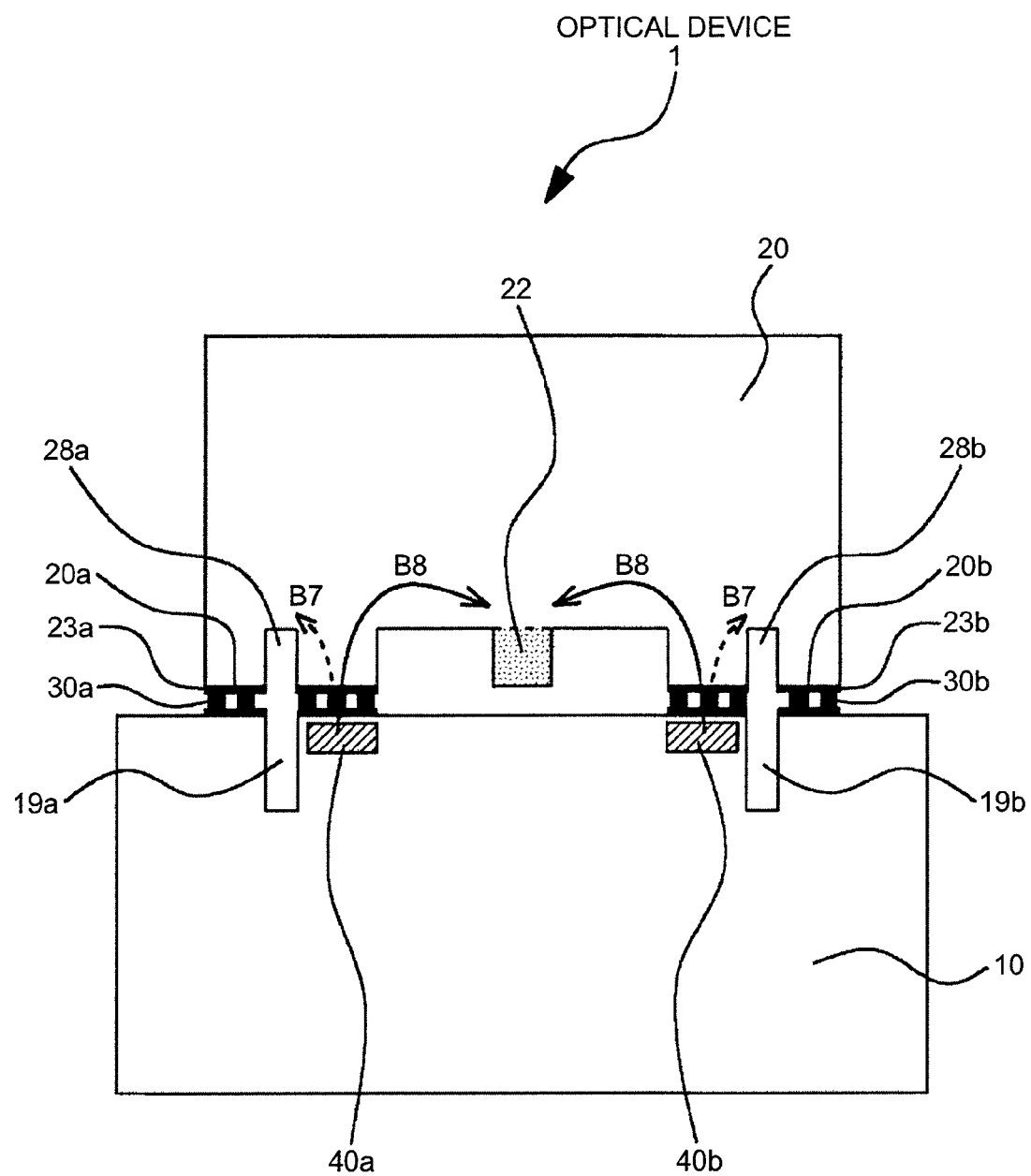
FIG. 11 is a cross sectional views of the optical device of a fifth embodiment of the present invention.
Figure 12A:
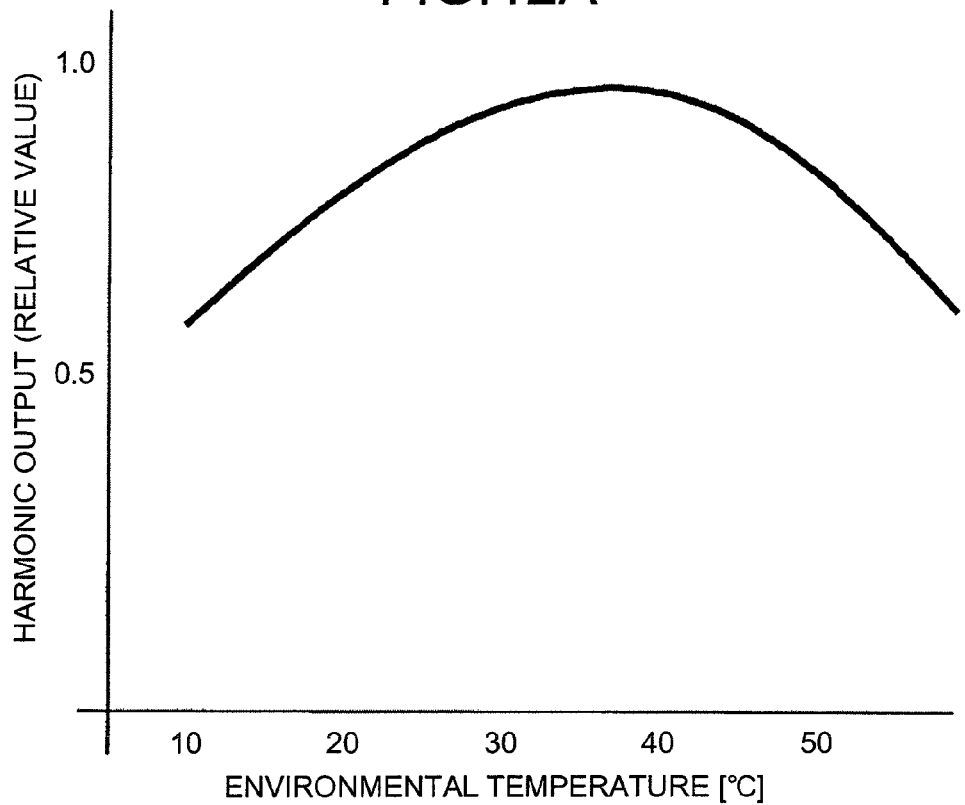
FIG. 12A is a graph depicting temperature dependency of a wavelength converting element.
Figure 12B:
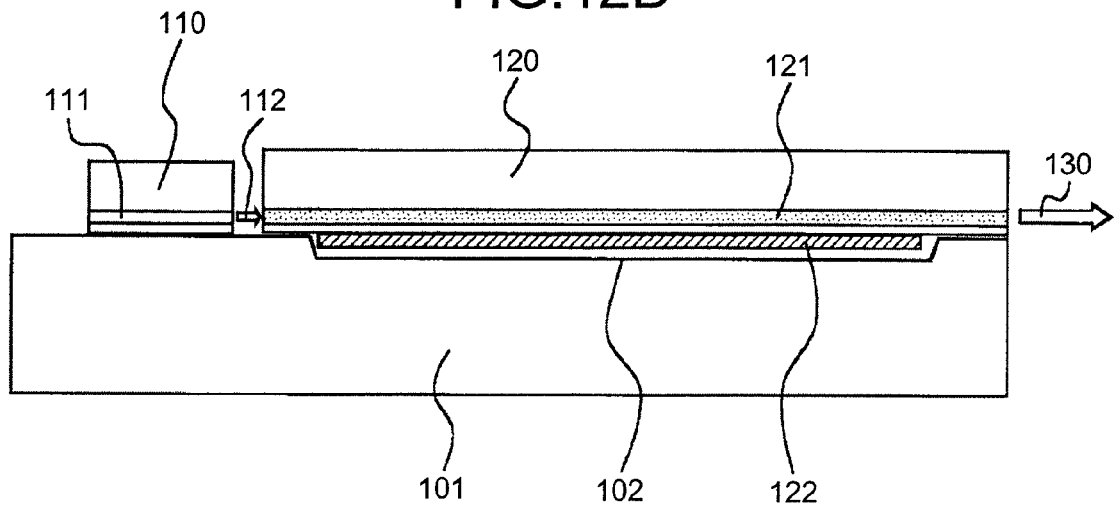
FIG. 12B is a cross sectional view along the length of a conventional laser optical source.

Description of Overview of Configuration of Fifth Embodiment: FIG. 11

Next, an overview of a configuration of the optical device of the fifth embodiment will be described using FIG. 11. The basic structure of the optical device of the fifth embodiment is similar to that of the first embodiment and therefore, identical components are given the same reference numerals and overlapping description is omitted hereinafter. FIG. 11 is a cross sectional view of the fifth embodiment, schematically depicting, like the first embodiment, a cross section along line A-A' sectioning the optical device 1 as depicted in FIG. 3 described above. Depiction of the metal member 4 is omitted. A top view of the embodiment is similar to that of the fourth embodiment (see FIG. 10B) and therefore, depiction thereof is omitted herein.

In FIG. 11, the wavelength converting element 20 is a converting wavelength element having a ridge-shape structure, similar to the first embodiment (see FIG. 1). At a lower portion of the wavelength converting element 20, the waveguide 22 is formed. Further, at the two planar portions 20a, 20b at a lower portion of the wavelength converting element 20, the Au thin films 23a, 23b are formed.

At a position opposing the planar portions 20a, 20b of the wavelength converting element 20 at an upper portion of the silicon substrate 10 described above, the micro bumps 30a, 30b made of Au are respectively formed. Consequently, the micro bumps 30a, 30b of the silicon substrate 10 and the Au films 23a, 23b at a lower portion of the wavelength converting element 20 are bonded at an ambient temperature, bonding the silicon substrate 10 and the wavelength converting element 20.

Further, near a surface of the silicon substrate 10 positioned directly below each of the micro bumps 30a, 30b, the heaters 40a, 40b are formed that adjust the temperature of the wavelength converting element 20. In other words, the micro bumps 30a, 30b are respectively formed in proximity to and superior to the heaters 40a, 40b and consequently, the heaters 40a, 40b and the micro bumps 30a, 30b are disposed near the waveguide 22 of the wavelength converting element 20.

Similar to the fourth embodiment, the groove portions 19a, 19b are formed in a surface of the silicon substrate 10, at the external side of the heaters 40a, 40b. In other words, the groove portion 19a is formed in a region on the external side of and along the heater 40a, while the groove portion 19b is formed in a region on the external side of and along the heater 40b.

At a lower portion of the wavelength converting element 20, at a position substantially opposing the two rows of groove portions 19a, 19b of the silicon substrate 10, two groove portions 28a, 28b are further formed. In other words, the groove portions 28a, 28b of the wavelength converting element 20, similar to the groove portions 19a, 19b of the silicon substrate 10, are formed in a direction along the length of the heaters 40a, 40b to prevent heat transfer between the region where the heater is dispose and other regions. Consequently, the groove portions 19a, 19b of the silicon substrate 10 and the groove portions 28a, 28b of the wavelength converting element 20 respectively oppose one another, and the micro bumps 30a, 30b are not formed in regions where the groove portions are disposed.

Consequent to this structure, diffusion of the heat from heater 40a, 40b to the region of the wavelength converting element 20 is suppressed (direction indicated by dotted arrow B7), whereby the heat is further concentrated at and transferred near the waveguide 22, which is the region intended for heating (direction indicated by solid arrow B8).

Thus, the fifth embodiment can efficiently perform temperature adjustment of the waveguide 22 of the wavelength converting element 20 by preventing diffusion of the heat generated by the heater, since the groove portions are formed on both the silicon substrate 10 and the wavelength converting element 20, with a purpose of preventing a transfer of heat between the region where the heater is disposed and other regions. The groove portions 28a, 28b may be a through hole in a portion of the wavelength converting element 20.

Furthermore, although the fourth and the fifth embodiments are ridge-type wavelength converting elements, the optical device having the groove portions is not limited hereto and may be the optical device of the second embodiment (proton-exchange-type wavelength converting element) or of the third embodiment (waveguide-embedded wavelength converting element), to which the groove portions are formed to prevent heat transfer.

An optical device of the present invention is an optical device in which an optical element that has a waveguide is mounted to a substrate. The optical device includes a heater formed on the substrate; and a micro bump that is disposed above the heater and in a region other than a region below the waveguide, that is made of Au, that bonds the substrate and the optical element, and that transfers to the optical element, heat generated by the heater. The optical element is mounted to the substrate such that the waveguide is in proximity to the substrate; and the heater and the micro bump are disposed near the waveguide.

In addition to the configuration above, the optical device of the present invention further includes a wavelength converting element as the optical element.

Furthermore, in the optical device of the present invention, the heater is formed in a region other than the region below the waveguide, in addition to the configuration above.

In addition to the configuration above, in the optical device, a groove portion or a through hole that prevents heat transfer between a region where the heater is disposed and other regions, is disposed in the substrate.

In addition to the configuration above, in the optical device, a groove portion or a through hole that prevents heat transfer between a region where the heater is disposed and other regions, is disposed in the optical element.

In addition to the configuration above, in the optical device the optical element is mounted to the substrate such that the waveguide faces toward the substrate.

In addition to the configuration above, in the optical device, the optical element is a waveguide-embedded type.

In addition to the configuration above, in the optical device, the substrate is a silicon substrate.

EFFECT

According to the optical device of the present invention, heat generated by a heater is transferred and applied to a wavelength converting element disposed as an optical element, thereby enabling temperature control (temperature management) of the wavelength converting element to be performed. Furthermore, bonding the substrate and the wavelength converting element by a micro bump formed of Au having excellent conductivity enables the heat generated by the heater to be transferred very efficiently to the wavelength converting element via the micro bump.

Further, formation of the heater on the substrate enables the heater to be energized directly from the substrate. Consequently, without electrical connection of the substrate and the wavelength converting element as an optical element, the structure of the optical device is simple and the fabrication process can also be simplified. In addition, since the heater on the substrate can be formed by a semiconductor process for fabricating the substrate, there is no need for new fabrication processes for the heater.

By forming the micro bump and the heater in a region other than that below the waveguide, drops in waveguide performance consequent to, for example, the micro bump contacting the waveguide, can be prevented.

By disposing a groove portion or a through-hole to prevent heat transfer between the region where the heater is disposed and other regions, the transfer of heat between the region where the heater is disposed and other regions can be prevented and a desired region can be efficiently heated. Furthermore, by disposing the heater near the waveguide of the wavelength converting element, the wavelength converting element can be heated efficiently and with precision.

INDUSTRIAL APPLICATION

The optical device of the present invention can be widely used in fields such as laser projectors and high density optical storage, as a short-wavelength (e.g., blue, green) laser optical source.

What is claimed is:

1. An optical device in which an optical element that has a waveguide is mounted to a substrate, the optical device comprising:
    a heater formed on the substrate; and
    a micro bump that is disposed above the heater and in a region other than a region below the waveguide, that is made of Au, that bonds the substrate and the optical element, and that transfers to the optical element, heat generated by the heater, wherein
    the optical element is mounted to the substrate such that the waveguide is in proximity to the substrate, and
    the heater and the micro bump are disposed near the waveguide.

2. The optical device according to claim 1, comprising a wavelength converting element as the optical element.

3. The optical device according to claim 1, wherein the heater is formed in a region other than the region below the waveguide.

4. The optical device according to claim 1, wherein a groove portion or a through hole that prevents heat transfer between a region where the heater is disposed and other regions, is disposed in the substrate.

5. The optical device according to claim 1, wherein a groove portion or a through hole that prevents heat transfer between a region where the heater is disposed and other regions, is disposed in the optical element.

6. The optical device according to claim 1, wherein the optical element is mounted to the substrate such that the waveguide faces toward the substrate.

7. The optical device according to claim 1, wherein the optical element is a waveguide-embedded type.

8. The optical device according to claim 1, wherein the substrate is a silicon substrate.

* * * * *